United States Patent [19]

Nicolaisen

[11] Patent Number: 5,610,380
[45] Date of Patent: Mar. 11, 1997

[54] TOUCH RESPONSIVE CONTROL PANEL

[76] Inventor: Mogens Nicolaisen, Pramvej 5, DK-8900, Randers, Denmark

[21] Appl. No.: 256,859

[22] PCT Filed: Jan. 28, 1993

[86] PCT No.: PCT/DK93/00034

§ 371 Date: Jul. 28, 1994

§ 102(e) Date: Jul. 28, 1994

[87] PCT Pub. No.: WO93/15518

PCT Pub. Date: Aug. 5, 1993

[30] Foreign Application Priority Data

Jan. 28, 1992 [DK] Denmark ................... 0100/92

[51] Int. Cl.⁶ ................................ H03K 17/975
[52] U.S. Cl. ........................... 200/600; 341/33
[58] Field of Search ................... 200/600, 5 A, 200/52 R; 361/680–682; 341/22, 33, 34; 307/116; H01H 13/70; H03K 17/96

[56] References Cited

U.S. PATENT DOCUMENTS

| 4,090,092 | 5/1978 | Serrano ........................... 200/600 |
| 4,250,495 | 2/1981 | Beckerman et al. ............... 341/33 |
| 4,290,052 | 9/1981 | Eichelberger et al. ............ 341/33 |
| 4,304,976 | 12/1981 | Gottbreht et al. ............. 200/600 X |
| 4,380,040 | 4/1983 | Posset ........................... 200/600 |
| 4,394,643 | 7/1983 | Williams ........................ 341/33 |
| 4,413,252 | 11/1983 | Tyler et al. ................... 341/33 |
| 4,614,937 | 9/1986 | Poujois ......................... 341/33 |
| 4,876,461 | 10/1989 | Gratke .......................... 307/116 |

FOREIGN PATENT DOCUMENTS

| 54306 | 6/1982 | European Pat. Off. ....... H03K 17/96 |
| 2728188 | 1/1979 | Germany ..................... H01H 13/70 |
| 3107400 | 11/1982 | Germany ..................... H03K 17/96 |
| WO89/02135 | 3/1989 | WIPO ......................... G06K 11/06 |

*Primary Examiner*—J. R. Scott
*Attorney, Agent, or Firm*—Antonelli, Terry, Stout & Kraus, LLP

[57] ABSTRACT

A touch sensitive control panel in accordance with the invention includes a plate having a front side and a back side. The front side has at least one marking identifying at least one corresponding touch sensitive area of the plate. Each touch sensitive area when touched by a user completes an operative coupling with one of a plurality of electrodes of at least one electronic circuit disposed on the back side to cause the production of a selected control signal by the at least one electronic circuit to which the operative coupling is completed by touching one touch sensitive area of the front side. The at least one electronic circuit and the plurality of electrodes are held in surface contact with the back side without the use of an intermediate plate.

21 Claims, 1 Drawing Sheet

TOUCH RESPONSIVE CONTROL PANEL

BACKGROUND OF THE INVENTION

1. Field of the Invention

The present invention relates touch sensitive control panels of the kind comprising a front plate preferably of a dielectric material such as glass, and electrodes disposed on a reverse side thereof together with electronic circuits where the front plate carries markings that indicate touch areas so that touching by a finger completes an operative coupling to respective electrodes disposed on the reverse side so that the panel unit provides selective control signals from the electronic circuits.

2. Description of the Prior Art

Such control panels are increasingly used in various kinds of electrical and electronic equipment because they may advantageously replace panels with mechanical switches or rotary or pushbutton activated elements. A light touch upon a selected area controls the desired function such as a starting or stopping or an increasing or decreasing control function without use of mechanically completed switching action. Normally the aforementioned type of control panel functions by a capacitive coupling.

In particular because this kind of control panel is known it is not necessary to discuss the general advantages of their use in detail here. Control panels are predominantly manufactured by specialty manufacturers because their manufacture is not performed by mounting of ready-made special switches and controllers and requires the manufacture of both the panel plate and at least the necessary electronic circuitry.

It has, however, been possible to prepare an intermediate stage where the manufacture of the panel plate itself is a specialized task but the electronic circuitry may be placed on a conventional printed circuit board prepared with suitable contacts for establishing contact with specific electrode areas on the reverse side of the front plate. These defined areas are typically made as a coating of graphite powder which has been fixed reliably to the reverse side of the front plate so that the electrode areas are located at a well-defined position and are easily accessible for establishing contact with projecting contact elements on the printed circuit board since these elements require only that the coatings abut the contact elements in an uncritical fashion.

However considerable contact problems still exist because mechanical fitting of the relevant contact parts is used. Contamination may make the establishment of an effective connection difficult.

SUMMARY OF THE INVENTION

According to the present invention the printed circuit board is eliminated in that the electronic components are placed directly on the panel plate to which they are fixed by cement to the electrode areas.

The important thing is that by using the panel plate to carry both the electrode areas and the electronic components the circuit board is eliminated and a totally integrated solution is obtained so that the manufacturing facility may construct the control panels with a high precision in an optimized manner having a high degree of functional reliability.

The panel plate may have any desired size or shape, including an arched or vaulted shape. The control panel may have a minimal thickness. The electronic components may be fastened by surface mounting (soldering) or cementing to the electrode areas or to other conductive layers on the panel plate or by cementing or casting the electronic components to the support.

The panel plate may be used as a printed circuit board, i.e. with fixed conductive strips between different terminal areas. However, the panel plate may also be used with a shielding coating around and between the operative electrode areas to provide high quality EMC shielding. The shielding coating may be used for fixing electronic components which are not electrically connected to the shield.

The coating itself may be differentiated to create different components such as resistors in a coating paste which has been formed. The coating may play an active role in providing a desired temperature compensation.

While the control panels of the invention normally use a capacitive touch coupling, the invention is not limited thereto in that other coupling principles may be used, e.g. based on inductive or optical sensing.

BRIEF DESCRIPTION OF THE DRAWINGS

An embodiment of the invention is shown in the drawings, in which.

DESCRIPTION OF THE PREFERRED EMBODIMENT

The control panel of the present invention is based on capacitive touch coupling of a glass plate 2. The front surface of the glass plate 2 has marked touch areas 4.

Figure 1:
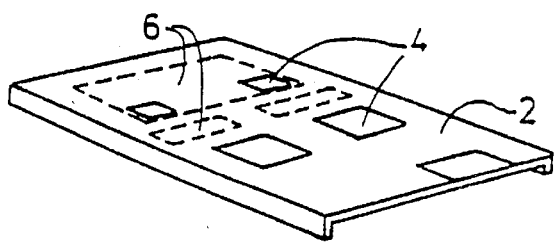
FIG. 1 is a perspective view of a control panel according to the invention seen from the front.
Figure 2:
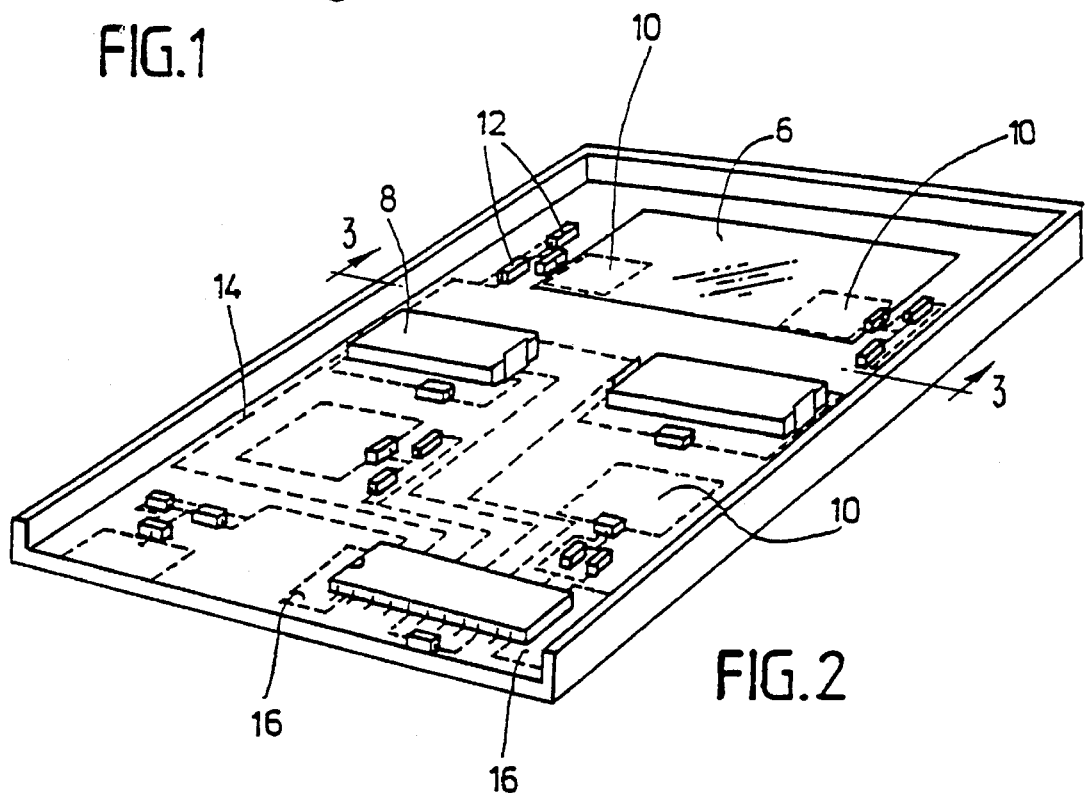
FIG. 2 is a perspective view of the control panel of the invention viewed from the back.

As shown in FIG. 2 a window area 6 may open toward the rear for showing a display which is independent of control functions performed by the plate. Other window areas may be covered with display units 8 which may be fastened directly to the glass plate 2.

Behind the areas 4 there are disposed conducting coating areas 10 on the reverse side of the control plate which by means of suitable terminals are connected to electronic components 12 which are fastened directly to the plate 2. Component leads or wires may be connected by soldering or cementing directly to the areas 10 or to conductor strips 14 which are connected thereto. The components may be mutually connected either by their own wires or by means of printed conductors. The connector for the whole element may be a multiple connector which is cemented thereto or even by wires leading therefrom.

On the areas outside the areas 10, there may be a conductive shielding coating 16 (See FIGS. 2 and 3) onto which may be fitted both components 12 and conductive strips 14. It is even possible to apply conductive coatings of a transparent type (ITO) so that transparent plate sections 6 or transparent, active coating areas 10 may be shielded.

Figure 3:
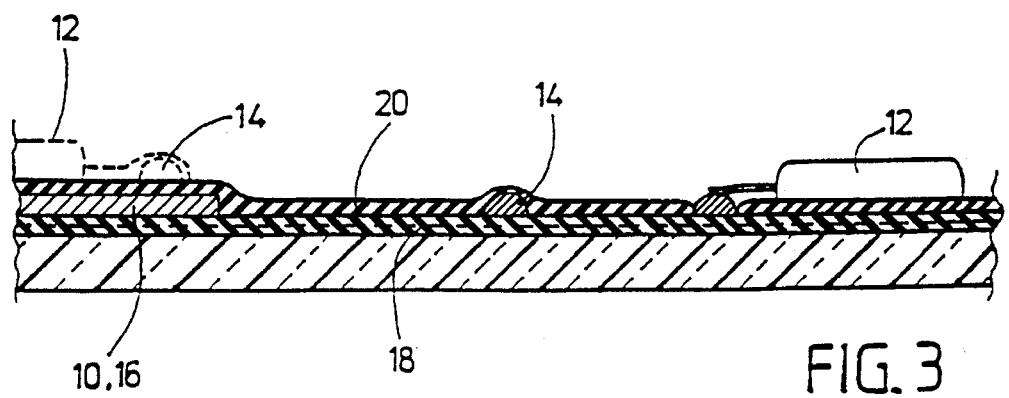
FIG. 3 is a sectional view through the same.

FIG. 3 shows an undercoat layer 18 applied directly to the glass plate. It may not only provide the color of the glass, but also as known from printed circuit technology act as a base for a subsequent printing of the conductive strips 14 and areas 10 which may be formed from a silver compound applied by screen printing. On top thereof is applied an overcoat layer 20 which generally covers the top surface of the control panel except at the relevant soldering points.

It is possible to print conductive strips on top of the layer 20 so that a lower shielding layer 16 may extend unbroken across large parts of the control panel.

As discussed above the invention is not limited to using a capacitive coupling mechanism for the touch coupling, because other useable principles are available, such as based on inductive or optical detection. The glass plate 2 will permit accordingly, the active components to advantageously be mounted directly on the glass panel.

Through the use of components directly mounted on the panel plate it will be particularly simple to make use of an attachment which provide discrete signals of acknowledgement of an operation performed on the panel.

I claim:

1. A touch sensitive control panel comprising:

a plate having a front side and a back side, the front side having at least one marking identifying at least one touch sensitive area of the plate and a conductive layer disposed on the back side being in registration with each touch sensitive area and, each touch sensitive area when touched by a user completing an operative coupling with the conductive layer in registration therewith and one of a plurality of electrodes of at least one electronic circuit disposed on the back side to cause a selected control signal to be produced by the at least one electronic circuit to which the operative coupling is completed by touching one touch sensitive area of the front side; and wherein the at least one electronic circuit, each conductive layer and the plurality of electrodes are in direct surface contact with the back side.

2. A touch sensitive control plate in accordance with claim 1 wherein:

the plate is a dielectric material.

3. A touch sensitive control plate in accordance with claim 2 wherein:

the dielectric plate is glass.

4. A touch sensitive control plate in accordance with claim 1 wherein:

the at least one electronic circuit is held on the back side by surface mounting.

5. A touch sensitive control plate in accordance with claim 1 wherein:

the at least one electronic component is held on the back side by cementing.

6. A touch sensitive control plate in accordance with claim 1 wherein:

the at least one electronic component is held on the back side by casting.

7. A touch sensitive control plate in accordance with claim 2 wherein:

the at least one electronic circuit is held on the back side by surface mounting.

8. A touch sensitive control plate in accordance with claim 2 wherein:

the at least one electronic component is held on the back side by cementing.

9. A touch sensitive control plate in accordance with claim 2 wherein:

the at least one electronic component is held on the back side by casting.

10. A touch sensitive control plate in accordance with claim 3 wherein:

the at least one electronic circuit is held on the back side by surface mounting.

11. A touch sensitive control plate in accordance with claim 3 wherein:

the at least one electronic component is held on the back side by cementing.

12. A touch sensitive control plate in accordance with claim 3 wherein:

the at least one electronic component is held on the back side by casting.

13. A touch sensitive control panel in accordance with claim 1 further comprising:

at least one conductive strip disposed on the back side, each conductive strip providing an electrical connection between one of the electrodes and one of the at least one electronic circuit.

14. A touch sensitive control panel in accordance with claim 2 further comprising:

at least one conductive strip disposed on the back side, each conductive strip providing an electrical connection between one of the electrodes and one of the at least one electronic circuit.

15. A touch sensitive control panel in accordance with claim 3 further comprising:

at least one conductive strip disposed on the back side, each conductive strip providing an electrical connection between one of the electrodes and one of the at least one electronic circuit.

16. A touch sensitive control panel in accordance with claim 1 further comprising:

at least one conductive shielding area disposed on the back side, each conductive shielding area being disposed at least in part between at least one electronic circuit and the front sides.

17. A touch sensitive control panel in accordance with claim 2 further comprising:

at least one conductive shielding area disposed on the back side, each conductive shielding area being disposed at least in part between at least one electronic circuit and the front sides.

18. A touch sensitive control panel in accordance with claim 3 further comprising:

at least one conductive shielding area disposed on the back side, each conductive shielding area being disposed at least in part between at least one electronic circuit and the front sides.

19. A touch sensitive control panel in accordance with claim 1 wherein:

at least one of the at least one electronic circuits produces an acknowledgment of touching one of the touch sensitive areas.

20. A touch sensitive control panel in accordance with claim 2 wherein:

at least one of the at least one electronic circuits produces an acknowledgment of touching one of the touch sensitive areas.

21. A touch sensitive control panel in accordance with claim 3 wherein:

at least one of the at least one electronic circuits produces an acknowledgment of touching one of the touch sensitive areas.

* * * * *